United States Patent [19]
Steger et al.

[11] Patent Number: 5,974,895
[45] Date of Patent: Nov. 2, 1999

[54] CAPACITIVELY MEASURING SENSOR AND READOUT CIRCUIT

[75] Inventors: Max Steger; Thomas Scheiter; Christofer Hierold, all of Munich; Reinhold Noe, Paderborn, all of Germany

[73] Assignee: Siemens Aktiengesellschaft, Munich, Germany

[21] Appl. No.: 08/880,651

[22] Filed: Jun. 23, 1997

[30] Foreign Application Priority Data

Jun. 26, 1996 [DE] Germany .............................. 196 25 666

[51] Int. Cl.⁶ ....................................................... G01B 7/16
[52] U.S. Cl. .................................. 73/769; 73/780; 73/724; 73/514.32
[58] Field of Search .............................. 73/769, 724, 514, 73/32, 862, 626, 780; 361/283.1–283.4

[56] References Cited

FOREIGN PATENT DOCUMENTS

| | | |
|---|---|---|
| 0 543 901 B1 | 6/1993 | European Pat. Off. . |
| 41 03 433 A1 | 8/1991 | Germany . |
| 44 01 999 C2 | 8/1994 | Germany . |
| 43 08 132 A1 | 9/1994 | Germany . |
| WO 96/12339 | 4/1996 | WIPO . |

OTHER PUBLICATIONS

Willy Sansen et al, Analog Circuit Design, Kluwer Academic Publishers, Dordrecht, 1994, pp. 163–181.

*Primary Examiner*—Robert Raevis
*Attorney, Agent, or Firm*—Hill & Simpson

[57] ABSTRACT

A capacitance to be measured is connected together with three further capacitances to form a bridge circuit, in which each two of the capacitors are connected in series, and these two series circuits are connected in parallel to one another, and which replaces a part of the input stage of a Σ-Δ modulator. As inputs of this bridge circuit, terminals are provided at the ends of these series circuits, and as outputs terminals are respectively provided between the capacitors connected one after the other in series. In a sensor realized thereby, two capacitively measuring sensor elements of the same type are used. These capacitors are built into the bridge circuit together with two equally large reference capacitors in such a way that exactly one measurement capacitor and one reference capacitor is La connected is connected to each input and to each output of the bridge circuit.

19 Claims, 2 Drawing Sheets

CAPACITIVELY MEASURING SENSOR AND READOUT CIRCUIT

BACKGROUND OF THE INVENTION

The present invention concerns a capacitively measuring sensor as a micromechanical semiconductor component, and a readout and evaluation circuit provided therefor.

For capacitively measuring sensors, such as for example pressure sensors and acceleration sensors, that have a high degree of sensitivity (that is, deliver a measurement signal that can be evaluated and is also very small in response to very small changes in a measurement quantity), evaluation circuits are required that convert the smallest changes in capacitance into an output signal that can be unambiguously allocated to the measurement quantity. Readout circuits are thus required that can be used for very small capacitances and changes thereof up to the region of a few 10 aF, and which are suited for monolithic integration together with capacitive sensors, which are realized in particular as a micromechanical component, preferably in All silicon. A capacitively measuring pressure sensor as a micromechanical component is specified for example in German reference DE 44 01 999 C2. A capacitively measuring acceleration sensor as a micromechanical component is for example specified in European reference EP 0 543 901 B1. The readout circuits should be capable of being coupled with evaluation circuits that convert an input signal into a bit-stream or into a digital word that can be read in by a microprocessor. Due to the very small charge quantities that have to be detected, a technique is required that on the one hand does not falsify the signal and on the other hand is sufficiently sensitive to enable a reading out. For this purpose, conventional analog amplifiers are largely used, and the amplified signal is subsequently converted analog/digital. Isolated use is also made of $\Sigma$-$\Delta$ modulators, as is specified for example in the article by C. Azeredo Leme and H. Baltes, "Interfaces for Microsensor Systems," in W. Sansen et al. (eds.), *Analog Circuit Design*, Kluwer Academic Publishers, Dordrecht 1994, pp. 163 to 181.

SUMMARY OF THE INVENTION

It is an object of the present invention to provide a readout circuit for very small capacitances and a capacitively measuring sensor, operated therewith, having increased sensitivity.

In general terms the present invention is a readout circuit for capacitively measuring sensors. In an input stage of a $\Sigma$-$\Delta$ modulator, there is a bridge circuit of four capacitors. This bridge circuit has two inputs and two outputs. In each pair of one of these inputs and one of these outputs, exactly one of the four capacitors is connected between the input and the output of this pair. Switches and a clock control are present, with which two different potentials can be applied in temporally alternating fashion to the two inputs of the bridge circuit.

Advantageous developments of the present invention are as follows.

The four capacitors are given by two pairs of capacitors with the same capacitance. The capacitors of each of these pairs are connected with different inputs and different outputs of the bridge circuit. Two balancing means are present that respectively have a number of capacitors and switches. The capacitors of these balancing means are connected parallel to one another with one of their terminals connected respectively to the same output of the bridge circuit, and can be connected alternatively via the switches to one of the inputs of the bridge circuit with their respective other terminal.

The four capacitors have the same capacitance.

The present invention is also a sensor with a readout circuit as described above. Two sensor elements of the same type are present, which respectively form a measurement capacitor. The capacitances of these measurement capacitors change in the same direction, given a change in a quantity to be measured. These measurement capacitors are connected as two of the four capacitors of the bridge circuit. The measurement capacitors are connected with different inputs and different outputs of the bridge circuit.

In an alternative sensor embodiment the capacitances of these measurement capacitors change in opposite directions, given a change in a quantity to be measured. The measurement capacitors are connected as two of the four capacitors of the bridge circuit. The measurement capacitors are connected with the same output of the bridge circuit.

Two reference elements of the same type are present, each of which forms a reference capacitor whose capacitance does not change given a change in a quantity to be measured. These reference elements are structured similarly to the sensor elements, and are fixed such that the capacitances of the reference capacitors are at least approximately equal to the capacitances of the measurement capacitors in a predetermined basic state of the sensor elements. These reference capacitors are connected as two of the four capacitors of the bridge circuit.

In a further embodiment the sensor is a pressure sensor, in which each sensor element has a membrane that is at least region-by-region electrically conductive. The membrane can be deformed in a way sufficient for a pressure. measurement, and is accessible with one surface to a medium whose pressure is to be measured, and forms a part of a measurement capacitor.

In yet another embodiment the sensor is an acceleration sensor, in which each sensor element has an at least region-by-region electrically conductive frame part that is movable in a way that is sufficient for an acceleration measurement. The frame part is maintained in a rest position by a spring-loaded suspension mount in the absence of inertial forces, and forms a part of a measurement capacitor.

In the inventive readout circuit, a second-order $\Sigma$-$\Delta$ modulator (abbreviated SDM in the following) with switched capacitor technique is used, the principle of-which is known. A capacitance to be measured is connected together with three further capacitances to form a bridge circuit in which each pair of the capacitors is connected in series, and these two series circuits are connected in parallel to one another. As inputs to this bridge circuit, terminals are provided at the ends of these series circuits, and, as outputs, terminals are respectively provided between the capacitors connected in series one after the other. This bridge circuit replaces a part of the input stage formed in conventional SDMs by two capacitors built into the circuit in suitable fashion. In this way, the output signal (bitstream) of the SDM is influenced by means of a detuning of this capacitance bridge upon change of a capacitance (for example, upon a change in the quantities acting on a capacitively measuring sensor).

In an inventively realized sensor, two sensor elements of the same type, which supply a capacitive signal, are preferably used together. The capacitors, or parts of these sensors operating as a capacitor (designated measurement capacitors in the following), are built into the bridge circuit of the inventive readout circuit, together with two reference capacitors, such that exactly one measurement capacitor and one reference capacitor are connected to each input and to each output of the bridge circuit. If two sensor elements are used, at which a change in the quantities acting on the sensor elements causes changes in capacitance opposed in direction to one another, the two measurement capacitors are connected in series and the two reference capacitors are connected in series.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
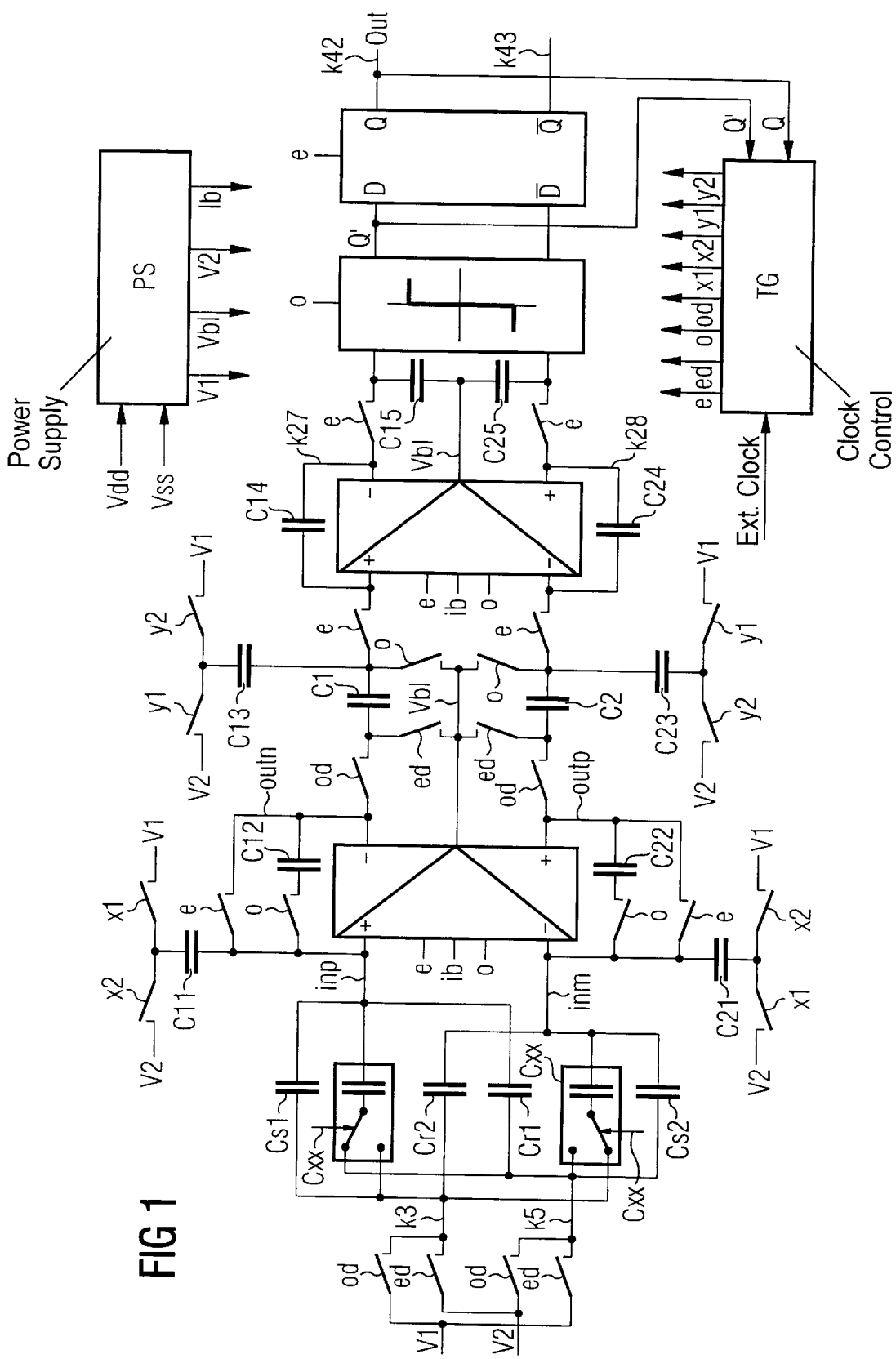
FIG. 1 shows an example of the complete readout circuit.

In FIG. 1, an example of an inventive readout circuit is shown in detail. For the $\Sigma$-$\Delta$ modulator, in principle all embodiments having the same function are possible. The input stage of this $\Sigma$-$\Delta$ modulator is modified with the bridge circuit, as shown, so that the capacitors Cs1 and Cs2, the measurement capacitors, and the capacitors Cr1 and Cr2, the reference capacitors, are connected, as drawn in at left in the circuit. The potentials V1 and V2 are alternately applied to the inputs k3 or, respectively, k5, whereby, of the subsequent switches, the two designated od are closed and the two designated ed are opened, or vice versa. The controlling for the clocked switching over of this switch ensues via a clock control TG (timing e generator), which is arranged in the circuit block of the SDM drawn in at the right in the figure. The outputs of the bridge circuit are designated inp and inm. The power supply is represented as the circuit block PS (power supply). The potentials V1 and V2 are preferably chosen in such a way that the potential differences between the drawn-in center potential Vbl and each of the potentials V1 and V2 are of the same magnitude, but have opposed signs ( V1=0.5 V, Vbl=2 V, V2=3.5 V).

The bridge circuit at the input of the SDM is designed in such a way that two sensor elements and two reference capacitors can be used, whereby a considerable increase in the sensitivity of the overall sensor is achieved, because two sensor elements of the same type are used simultaneously for the measurement, and the readout circuit evaluates the same-direction capacitance changes of the two sensor elements such that a significant rise in the signal level results in comparison with conventional readout methods.

Figure 2:
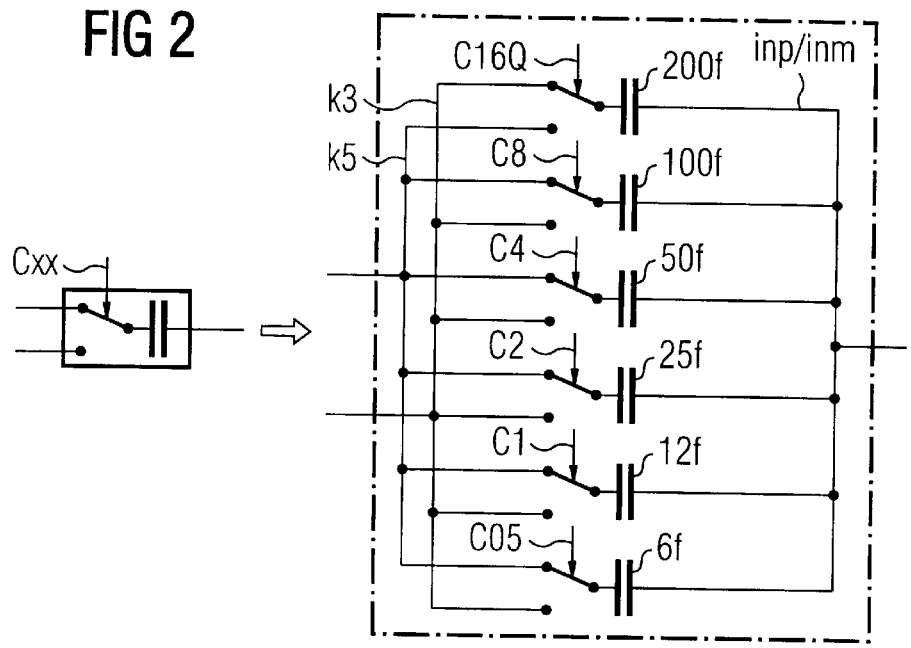
FIG. 2 shows a detail from the circuit in FIG. 1.

In a preferred embodiment, the bridge circuit is additionally provided with balancing means. An example of such a balancing means is shown in more detail in FIG. 2. This balancing means is formed by a number of capacitors connected in parallel with one another, with one of their terminals connected respectively to the same output of the bridge circuit, and whose capacitance values are weighted. The capacitors can, for example, as shown in the figure, have the $2^n$-fold capacitance (n=0, 1, 2, . . . ) of a particular capacitance value (here 6 fF). These capacitance values are chosen with a view to achieving a dense sequence of settable capacitance values with as few capacitors as possible. Via the switches C05, C1, C2, C4, C8, C16Q (combined as Cxx in FIG. 1), the other terminals of these capacitors can alternatively be connected to the input k3 or to the input k5 of the bridge circuit. A switching over inside this balancing means thus brings it about that a capacitance connected in parallel to a capacitor of the bridge circuit ( to one of the measurement capacitors) is raised by a certain value, and that a capacitance connected in parallel to the capacitor connected in series with this named capacitor ( to the reference capacitor associated with the relevant measurement capacitor) is reduced by the same determined value.

A balancing means of this sort is preferably used in both branches of the bridge circuit, i.e. in both series circuits of each pair of capacitors (Cs1 and Cr1 or, respectively, Cs2 and Cr2). With the use of two sensor elements of the same type with equally large capacitances, the two balancing means are switched over in such a way that both overall capacitances allocated to a sensor element (measurement capacitor and capacitors, connected in parallel thereto, of the associated balancing means) become larger smaller), and both overall capacitances of the allocated reference capacitors (reference capacitor and capacitors connected in parallel thereto of the balancing means) become smaller (larger). In those cases in which the capacitances of the measurement capacitors are equally large (same type of sensor elements) and the capacitances of the reference capacitors are equally large, but the capacitances of the measurement and reference capacitor are different, the overall capacitances that are authoritative for the balancing of the-bridge circuit are matched to one another in such a way, through suitable adjustment of the balancing means, that the result corresponds to a bridge circuit of four capacitors of the same capacitance. This thus means that the two balancing means are actuated in the same direction in relation to the ratio of the capacitances of the associated measurement and reference capacitors in both branches, in order to achieve as great a symmetry of the bridge circuit as possible. A zero point displacement in the control range of the SDM is thereby achieved.

If two capacitively measuring sensor elements are used whose capacitances change in opposed directions to one another upon a change in the detected influencing quantity, these sensor elements are connected in the bridge circuit to the same output inm or inp, i.e. as capacitors Cs1 and Cr1 or as capacitors Cs2 and Cr2.

In the specified exemplary embodiment, the bitstream at the output of the SDM can be filtered with a third-order decimation filter. The 16-bit word that arises therefrom is converted into a serial format with the SCI protocol, and is thus ready for a subsequent microprocessor.

In an inventive embodiment of a sensor as a micromechanical semiconductor component, two capacitively measuring sensor elements of the same type, for example, two pressure sensor membranes or two movable frame parts for the determination of occurrent inertial forces (acceleration sensor), are integrated on one chip. The measurement capacitors formed by these sensor elements, which always have the same capacitance even given changes in the influencing quantities detected by the sensor (disregarding unavoidable manufacturing tolerances), are connected as capacitors Cs1 and Cs2 in the bridge circuit of the readout circuit. The reference capacitors Cr1 and Cr2 are formed for example by two sensor elements of just this type, whose capacitances are however maintained by additional means at a constant value, which is preferably equal to a normal or rest value, by further means.

In a pressure sensor, the sensor elements are formed by means of an electrically conductive membrane layer that is arranged over a hollow space formed in the chip, and which comprises a surface that is accessible to an external medium whose pressure is to be-measured. The capacitance is measured between this membrane layer and a conductively doped region in the chip. The corresponding sensor elements, to be used as reference capacitors, are then for example, formed by a corresponding membrane layer, which however is outwardly covered; the hollow space is not completely etched out, so that the membrane layer is also held fast in this direction and thus cannot be moved. Due to the at least largely present hollow space under the membrane layer of the sensor elements used as reference capacitors, the dielectric constant here is approximately equal to the dielectric constant of the (actual) sensor elements used as measurement capacitors. All four capacitances are thus equally large to a sufficient approximation. Imprecisions can be eliminated, as specified above, by means of two compensating means. The capacitors of these compensating means are preferably fashioned in the same way as the remaining capacitors in the circuit, for example, by means of semiconductor layers or printed conductors insulated from one another.

In an inventively realized acceleration sensor, the sensor elements are formed by two movable electrically conductive frame parts of the same type that are held in a rest position by means of spring-loaded suspension devices if there occur no inertial forces in the direction of motion. The capacitances are measured between this frame part and a counter-electrode that is fixed in relation to the chip. The reference capacitors can here likewise be formed by two further frame parts of the same type with counter-electrodes. The frame parts of the reference capacitors are not movably suspended, but rather are fixedly anchored in the position corresponding to the rest position.

If two capacitively measuring sensor elements are used whose capacitances change in directions opposite to one another given a change in the detected influencing quantity, the same readout circuit is used, but the measurement capacitors in the same branch of the bridge circuit are connected in series one after the other (as Cs1 and Cr1 or as Cs2 and Cr2). For example, this is the case in a sensor in which the sensor elements are formed from a common movable, electrically conductive center plate and a respective counter-electrode arranged fixedly above or below it (pressure sensor or acceleration sensor), or in a sensor in which a movable, electrically conductive frame part is moved back and forth between two counter-electrodes arranged laterally thereto on opposite sides (acceleration sensor).

In place of the fixed additional sensor elements, which in themselves have at least approximately the same capacitance as the actual sensor elements, the reference capacitors can be formed as components of the electronic circuit, for example, by semiconductor layers or conductor paths insulated from one another. The balancing then generally required with the capacitances of the sensor elements then ensues through the specified balancing means. The reference capacitors can in particular be a component of the balancing means, that is one of the capacitors connected in parallel to one another in the balancing means.

Figure 3:
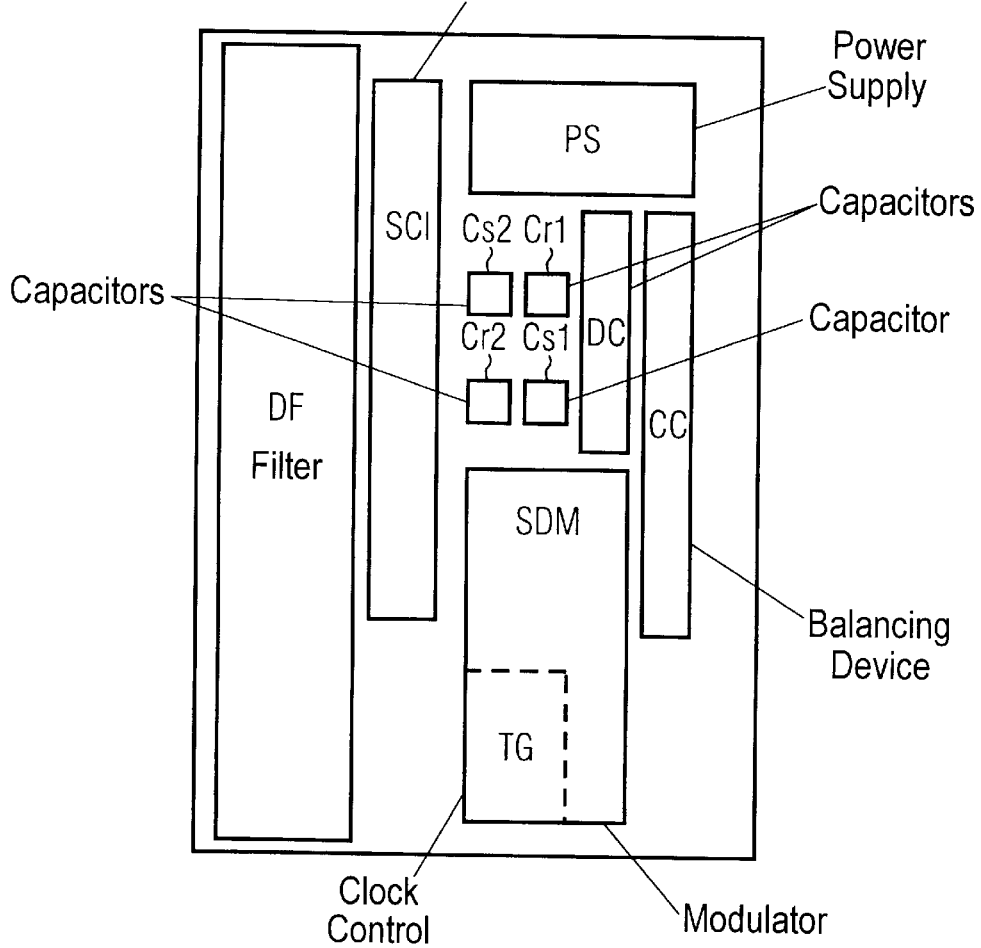
FIG. 3 shows a schema of an inventive sensor realized as a chip.

FIG. 3 shows a schematic diagram of a chip with an inventively realized sensor. The sensor elements of the measurement capacitors Cs1, Cs2 and the fixed but otherwise similar sensor elements of the reference capacitors Cr1, Cr2 are indicated by pressure sensor membranes of the same size. As circuit blocks, the power supply PS, the circuit part of the balancing means CC outfitted with capacitors, and the $\Sigma$-$\Delta$ modulator SDM with the clock control TG are shown. For the verification of the manner of functioning of the circuit, by means of built-in switches the bridge circuit can be replaced by another bridge circuit made of four additional capacitors integrated on the chip. This additional bridge circuit, used for test purposes, is formed by the capacitor arrangement shown as a circuit block of diagnostic capacitors DC. The above-mentioned decimation filter DF and the SCI interface SCI (clock divider and SCI-interface circuits) are preferably likewise integrated on the chip.

In a manner similar to the diagnostic capacitors, additional sensor complexes of sensor elements that have a different sensitivity region or detect other influencing quantities can be connected into the input stage of the SDM. In this way, a multirange sensor or, respectively, multiple sensor is obtained.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A readout circuit for capacitively measuring sensors, comprising:
   in an input stage of a $\Sigma$-$\Delta$ modulator, a bridge circuit having four capacitors;
   said bridge circuit having two inputs and two outputs;
   in each pair of one of said two inputs and one of said two outputs, respectively one of the four capacitors is connected between the input and the output of said each pair; and
   switches and a clock control with which two different potentials are applied in temporally alternating fashion to the two inputs of the bridge circuit.

2. The readout circuit according to claim 1,
   wherein the four capacitors are formed by two pairs of capacitors with the same capacitance,
   wherein capacitors of each of said pairs are connected with different inputs and different outputs of the bridge circuit,
   wherein two balancing devices are present that respectively have a number of capacitors and switches, and
   wherein the capacitors of said balancing devices are connected in parallel to one another with one of their terminals connected respectively to a common output of the bridge circuit, and are connectable alternatively via the switches to one of the inputs of the bridge circuit with their respective other terminal.

3. The readout circuit according to claim 1, wherein the four capacitors have the same capacitance.

4. The readout circuit according to claim 1,
   wherein two sensor elements of a common type, each forming a measurement capacitor, form a sensor,
   wherein capacitances of said measurement capacitors change in a common direction, given a change in a quantity to be measured,
   wherein said measurement capacitors ard connected as two of the four capacitors of the bridge circuit, and
   wherein the measurement capacitors are connected with different inputs and different outputs of the bridge circuit.

5. The readout circuit according to claim 4,
wherein two reference elements of a common type are present, each of which forms a reference capacitor whose capacitance does not change given a change in a quantity to be measured,
wherein said reference elements are structured similarly to the sensor elements, and are fixed such that capacitances of the reference capacitors are at least approximately equal to capacitances of the measurement capacitors in a predetermined basic state of the sensor elements, and
wherein said reference capacitors are connected as two of the four capacitors of the bridge circuit.

6. The readout circuit according to claim 4, wherein the sensor is a pressure sensor, wherein each sensor element has a membrane that is at least region-by-region electrically conductive, which membrane is deformable for a pressure measurement, and which is accessible with one surface to a medium whose pressure is to be measured, and which forms a part of a measurement capacitor.

7. The readout circuit according to claim 4, wherein the sensor is an acceleration sensor, wherein each sensor element has an at least region-by-region electrically conductive frame part that is movable for an acceleration measurement, and that is maintained in a rest position by a spring-loaded suspension mount in the absence of inertial forces, and that forms a part of a measurement capacitor.

8. The readout circuit according to claim 1,
wherein two sensor elements of a common type, each forming a measurement capacitor, form a sensor,
wherein capacitances of said measurement capacitors change in opposite directions, given a change in a quantity to be measured,
wherein said measurement capacitors are connected as two of the four capacitors of the bridge circuit, and
wherein the measurement capacitors are connected to a common output of the bridge circuit.

9. The readout circuit according to claim 8,
wherein two reference elements of a common type are present, each of which forms a reference capacitor whose capacitance does not change given a change in a quantity to be measured,
wherein said reference elements are structured similarly to the sensor elements, and are fixed such that capacitances of the reference capacitors are at least approximately equal to capacitances of the measurement capacitors in a predetermined basic state of the sensor elements, and
wherein said reference capacitors are connected as two of the four capacitors of the bridge circuit.

10. The readout circuit according to claim 8, wherein the sensor is a pressure sensor, wherein each sensor element has a membrane that is at least region-by-region electrically conductive, which membrane is deformable for a pressure measurement, and which is accessible with one surface to a medium whose pressure is to be measured, and which forms a part of a measurement capacitor.

11. The readout circuit according to claim 8, wherein the sensor is an acceleration sensor, wherein each sensor element has an at least region-by-region electrically conductive frame part that is movable for an acceleration measurement, and that is maintained in a rest position by a spring-loaded suspension mount in the absence of inertial forces, and that forms a part of a measurement capacitor.

12. A readout circuit and sensor system for capacitively measuring sensors, comprising:
in an input stage of a $\Sigma$-$\Delta$ modulator, a bridge circuit having four capacitors;
said bridge circuit having two inputs and two outputs;
in each pair of one of said two inputs and one of said two outputs, respectively one of the four capacitors is connected between the input and the output of said each pair;
switches and a clock control with which two different potentials are applied in temporally alternating fashion to the two inputs of the bridge circuit;
two sensor elements of a common type, each forming a measurement capacitor, that form a sensor;
capacitances of said measurement capacitors changing in a common direction, given a change in a quantity to be measured;
said measurement capacitors connected as two of the four capacitors of the bridge circuit; and
the measurement capacitors connected with different inputs and different outputs of the bridge circuit.

13. The readout circuit and sensor system according to claim 12,
wherein two reference elements of a common type are present, each of which forms a reference capacitor whose capacitance does not change given a change in a quantity to be measured,
wherein said reference elements are structured similarly to the sensor elements, and are fixed such that capacitances of the reference capacitors are at least approximately equal to capacitances of the measurement capacitors in a predetermined basic state of the sensor elements, and
wherein said reference capacitors are connected as two of the four capacitors of the bridge circuit.

14. The readout circuit and sensor system according to claim 12, wherein the sensor is a pressure sensor, wherein each sensor element has a membrane that is at least region-by-region electrically conductive, which membrane is deformable for a pressure measurement, and which is accessible with one surface to a medium whose pressure is to be measured, and which forms a part of a measurement capacitor.

15. The readout circuit and sensor system according to claim 12, wherein the sensor is an acceleration sensor, wherein each sensor element has an at least region-by-region electrically conductive frame part that is movable for an acceleration measurement, and that is maintained in a rest position by a spring-loaded suspension mount in the absence of inertial forces, and that forms a part of a measurement capacitor.

16. A readout circuit and sensor system for capacitively measuring sensors, comprising:
in an input stage of a $\Sigma$-$\Delta$ modulator, a bridge circuit having four capacitors;
said bridge circuit having two inputs and two outputs;
in each pair of one of said two inputs and one of said two outputs, respectively one of the four capacitors is connected between the input and the output of said each pair; switches and a clock control with which two different potentials are applied in temporally alternating fashion to the two inputs of the bridge circuit;
two sensor elements of a common type, each forming a measurement capacitor, that form a sensor;
capacitances of said measurement capacitors changing in opposite directions, given a change in a quantity to be measured;

said measurement capacitors connected as two of the four capacitors of the bridge circuit; and the measurement capacitors connected to a common output of the bridge circuit.

17. The readout circuit and sensor system according to claim 16, wherein two reference elements of a common type are present, each of which forms a reference capacitor whose capacitance does not change given a change in a quantity to be measured, wherein said reference elements are structured similarly to the sensor elements, and are fixed such that capacitances of the reference capacitors are at least approximately equal to capacitances of the measurement capacitors in a predetermined basic state of the sensor elements, and wherein said reference capacitors are connected as two of the four capacitors of the bridge circuit.

18. The readout circuit and sensor system according to claim 16, wherein the sensor is a pressure sensor, wherein each sensor element has a membrane that is at least region-by-region electrically conductive, which membrane is deformable for a pressure measurement, and which is accessible with one surface to a medium whose pressure is to be measured, and which forms a part of a measurement capacitor.

19. The readout circuit and sensor system according to claim 16, wherein the sensor is an acceleration sensor, wherein each sensor element has an at least region-by-region electrically conductive frame part that is movable for an acceleration measurement, and that is maintained in a rest position by a spring-loaded suspension mount in the absence of inertial forces, and that forms a part of a measurement capacitor.

* * * * *